(12) United States Patent
Fujii

(10) Patent No.: US 6,777,719 B1
(45) Date of Patent: Aug. 17, 2004

(54) CHIP LIGHT-EMITTING DEVICE

(75) Inventor: Takehiro Fujii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/674,522

(22) PCT Filed: Mar. 21, 2000

(86) PCT No.: PCT/JP00/01704

§ 371 (c)(1),
(2), (4) Date: Jan. 2, 2001

(87) PCT Pub. No.: WO00/57491

PCT Pub. Date: Sep. 28, 2000

(30) Foreign Application Priority Data

Mar. 19, 1999 (JP) .......................................... 11-075508

(51) Int. Cl.[7] .......................... H01L 27/15; H01L 33/00
(52) U.S. Cl. .............................. 257/99; 100/79; 100/88; 100/89; 100/91; 313/500; 313/505; 313/512
(58) Field of Search ............................ 257/99, 79, 100, 257/88, 89, 91, 693, 698, 699; 313/500, 505

(56) References Cited

U.S. PATENT DOCUMENTS 5,814,837 A * 9/1998 Okazaki ....................... 257/91
RE36,614 E * 3/2000 Lumbard et al. ........... 313/500
6,093,940 A * 7/2000 Ishinaga et al. .............. 257/99

FOREIGN PATENT DOCUMENTS

JP              59-9564      * 2/1984

* cited by examiner

Primary Examiner—Jerome Jackson
Assistant Examiner—Joseph Nguyen
(74) Attorney, Agent, or Firm—Arent Fox, PLLC

(57) ABSTRACT

The notch 17 is formed at one end of the board (12) and the two notches (18a and 18b) are formed at both sides of the other end. The first and second electrode patterns (13 and 14) covering, which cover the notches formed at both ends, are formed on the board surface, the light emitting diode (LED) chip (11) is connected to the first electrode pattern (13) and the electrode (11a) of the LED chip (11) and the surface electrode (14a) of the second electrode pattern (14) are bonded to each other with the metal wire (15). The LED chip (10) and the metal wire (15) are embedded with the translucent resin mold 16. Wire bonding on the surface electrode (14a) of the second electrode pattern (14) with the other end (15b) of the metal wire is made on the board 12 located between the two notches (18a and 18b). As a result, wire bonding can be made stably. Moreover, the polarity of the LED chip can be checked easily based on the appearance. Furthermore, handling jprocess can be performed smoothly.

5 Claims, 3 Drawing Sheets

CHIP LIGHT-EMITTING DEVICE

TECHNICAL FIELD

The present invention relates to the ultra small-sized chip type light emitting device using a light emitting diode (LED) chip which can obtain the symmetric luminous intensity distribution in a longitudinal direction on a board and can enhance wire bonding reliability.

BACKGROUND

A small-sized chip type light emitting device with a light emitting diode (LED) chip is known as a conventional light emitting source. FIG. 2 is a perspective view showing an example of such chip type light emitting device. FIG. 2 illustrates that a pair of electrode patterns 3 and 4 comprised of conductive layer such as copper (Cu) plate layer is formed at the both ends of the board 2. One electrode pattern 3 consists of the surface electrode 3a, side face electrode 3b and back electrode 3c.

The other electrode pattern 4 also consists of the surface electrode 4a, side face electrode 4b and back electrode 4c. The side face electrode 3b and side face electrode 4b of a pair of electrode patterns 3 and 4 form several elliptical through holes in parallel on an original large-sized board on which the board 2 can be obtained by dividing, the internal surface of the elliptical though holes is plated with Cu, etc., and the surface electrodes 3a/4a and back electrodes 3c/4c of a pair of electrode patterns 3 and 4 are connected to each other.

The pad 3p is formed on the surface electrode 3a of one electrode pattern 3 and the LED chip 1 is mounted there by die-bonding. One end 5a of the metal wire 5 is connected electrically to the electrode 1a of the LED chip 1 by wire bonding. The other end 5b of the metal wire 5 is connected electrically to the surface electrode 4a of the other electrode pattern 4 by wire bonding. The ultrasonic wave is used in this wire bonding.

The LED chip 1 mounted on the board 2, in which the lower electrode is connected to the surface electrode 3a of one electrode pattern 3 by the wiring bonding, and the metal wire 5 connected electrically to the upper electrode 1a of the LED chip 1 and to the surface electrode 4a of the other electrode pattern 4 by wire bonding are sealed with the translucent resin mold 6. The positions of both ends of this translucent resin mold 6 are located separately from each other at the inside of both ends of the board 2. The chip type light emitting device 20 is formed as mentioned above.

At the handling such as transportation, etc. for automatic mounting to a printed board, etc., the translucent resin mold 6 is picked up by a chuck and the chip type light emitting device 20 is transferred. In the configuration shown in FIG. 2, both ends of the translucent resin mold 6 are located at the inside of the surface electrodes 3a and 4a of a pair of electrode patterns 3 and 4. Therefore, the length of the translucent resin mold 6 is shorter than that of the board 2 of the chip type light emitting device 20, and the contact area for picking up becomes smaller, so if the size of the board 2 becomes 1.6 mm (length)×0.8 mm (width) or less, the handling cannot be performed smoothly.

FIG. 3 and FIG. 4 are perspective views showing an example of conventional another chip type light emitting device and the example illustrates that the semi-circular notches 7 and 8 have been formed at both ends of the board 2. FIG. 5 is a characteristics diagram showing the distribution of luminous intensity I of the chip type light emitting device of FIG. 3. In FIG. 3 and FIG. 4, the same places as FIG. 2 or the points corresponding to FIG. 2 are marked with the same symbols. In the example of FIG. 3, the side face electrodes 3b and 4b of a pair of electrode patterns 3 and 4 are formed at the internal face of the semi-circular notches 7 and 8 which are formed at both ends of the board 2.

The surface electrodes 3a and 4a of a pair of electrode patterns 3 and 4 extend to a place where those electrodes cover the upper faces of the notches 7 and 8 and both ends of the translucent resin mold 6 and both longitudinal ends of the board 2 are aligned. In the example of FIG. 3, the surfaces of the notches 7 and 8 are covered with the surface electrodes 3a and 4a of a pair of electrode patterns 3 and 4. Therefore, the resin does not flow into the notches 7 and 8 when the translucent resin mold 6 is processed.

In the example of FIG. 3, both ends of the translucent resin mold 6 are located at both longitudinal ends of the board 2. Therefore, this example has the advantage of securing the surface area of the translucent resin mold 6 to the extent that the said handling can be performed smoothly even if the chip type light emitting device 30 is downsized.

However, assuming that both ends of the translucent resin mold 6 are located at both longitudinal ends of the board 2 as shown in FIG. 3, if the board size becomes small, e.g., 1.6 mm×0.8 mm, the LED chip cannot be centered on the board 2 as shown in FIG. 4.

In the example of chip type light emitting device 40 of FIG. 4, the LED chip 1 is mounted at a position shifted to a longitudinal center of the board 2 and the other end 5b of the metal wire 5 is bonded at a position close to the end of the board 2. That is, the other end 5b of the metal wire 5 is bonded at a position where the surface electrode 4b of the electrode pattern 4 covers the notch 8.

As described above, a position to bond the other end 5b of the metal wire is located on the surface electrode 4b which covers the upper face of the notch 8. Therefore, the notch 8 is located under a place where wire bonding is performed and the mechanical strength of horn support deteriorates at wire bonding with the ultrasonic wave.

Therefore, enough pressure cannot be applied to the horn which propagates the ultrasonic wave at the ultrasonic wave processing and the surface electrodes 4b of the electrode pattern 5 and the other end 5b of the metal wire cannot be bonded completely to each other by the ultrasonic wave. To enhance the reliability of bonding with the ultrasonic wave, the configuration illustrated in FIG. 3 is adopted. However, in FIG. 3, the LED chip 1 is mounted at the off-centered position on the board 2.

In the example of FIG. 3, the LED chip 1 cannot be centered on the board 2. As a result, the LED chip 1 is located at the decentered position on the translucent resin mold 6 also. So, as shown in the luminous intensity characteristics diagram of FIG. 5, there was a problem that the symmetric luminous intensity distribution cannot be obtained in a longitudinal direction of the board.

DISCLOSURE OF INVENTION

The present invention was made taking such problem into consideration and the purpose of the present invention is to offer the ultra small-sized chip type light emitting device which can obtain the symmetric luminous intensity distribution in a longitudinal direction of the board even if the board is downsized and which can enhance wire bonding reliability.

The chip type light emitting device offered by the present invention comprising: a board of nearly rectangular shape in a plane view; first and second electrode patterns formed at both ends of a surface of the board; a light emitting diode (LED) chip mounted on the first electrode pattern; a metal wire connected to the LED chip and the second electrode pattern by wire bonding; and a translucent resin mold which seals the LED chip and the metal wire;

wherein one notch is formed at one end of the board at the first electrode pattern side and two notches are formed at both sides of the other end of the board at the second electrode pattern side, and the positions at both ends of the translucent resin mold are arranged to the positions at both ends in a longitudinal direction of the board.

The preferred embodiment of the present invention features that the LED is almost centered on the board.

The preferred embodiment of the present invention features that the board size is 1.6 mm×0.8 mm or less.

The preferred embodiment of the present invention features that the metal wire is connected to the LED chip and the surface electrode of the second electrode pattern, which is located between the two notches formed at both sides of the other end of the board at the second electrode pattern side, by wire bonding.

The preferred embodiment of the present invention features that one notch formed at the one end of the board at the first electrode pattern side is semi-cylindrical and the two notches formed at both sides of the other end of the board at the second electrode pattern side are quarter-cylindrical.

According to the present invention, two notches are formed at both side of one end of the board. Therefore, even if a wire bonding position is close to the end of the board, wire bonding of the second electrode pattern and metal wire is made stably on the bard between such two notches and the LED chip can be centered on the board. Therefore, the ideal symmetric luminous intensity characteristics can be obtained in a longitudinal direction of the board.

One notch is formed at one end of the board and two notches are formed at the other end. So, the polarity of the LED chip can be checked easily. If the translucent resin mold is milk white, the LED chip embedded in the translucent resin mold is illegible. However, one notch is formed at one end of the board and two notches are formed at the other end. Therefore, it is obvious that the electrode structure is asymmetric and the polarity can be checked easily because of the appearance of chip type light emitting device.

Moreover, the positions of both ends of translucent resin mold are arranged to the positions of both ends in a longitudinal direction of the board. Therefore, the contact area for picking up can be increased and handling process can be performed smoothly to ultra small-sized chip type light emitting device.

DESCRIPTION OF THE PREFERRED EMBODIMENTS

Figure 1:
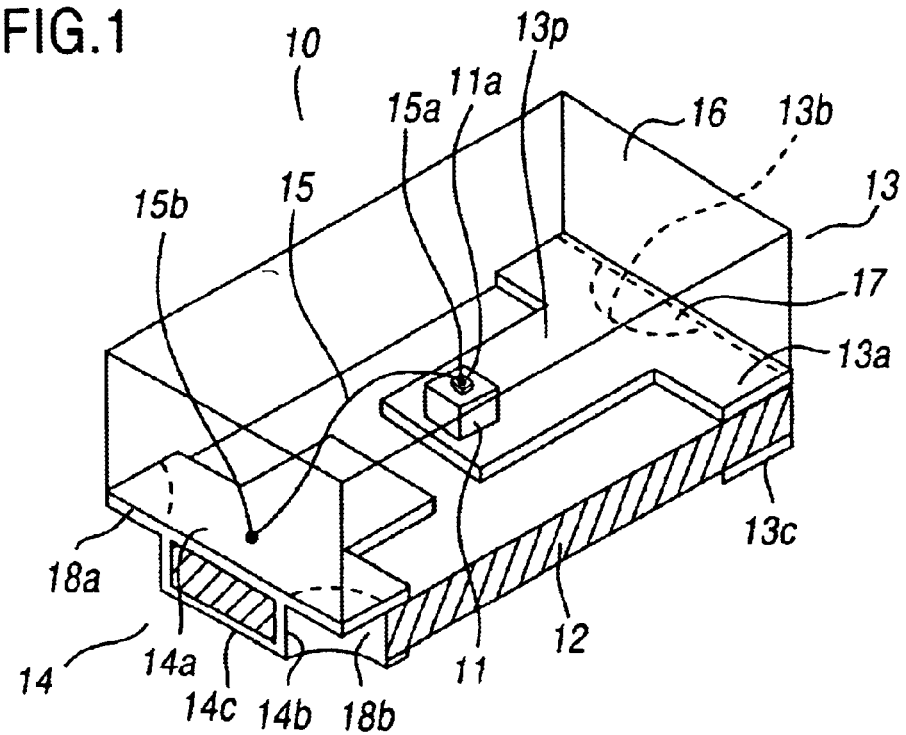
FIG. 1 is a perspective view which illustrates the chip type light emitting device with the embodiment of the present invention.
Figure 2:
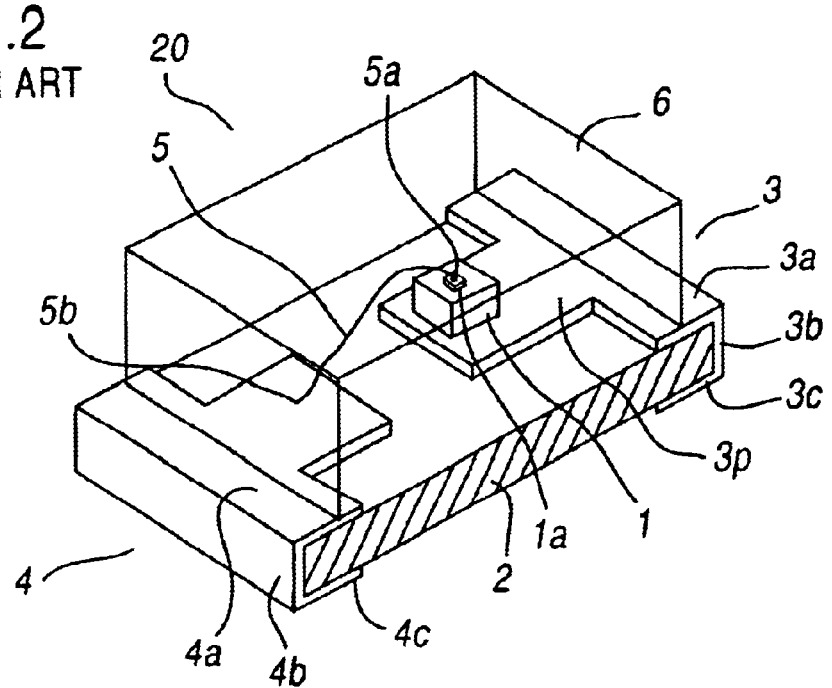
FIG. 2 is a perspective view which summarizes a conventional chip type light emitting device.
Figure 3:
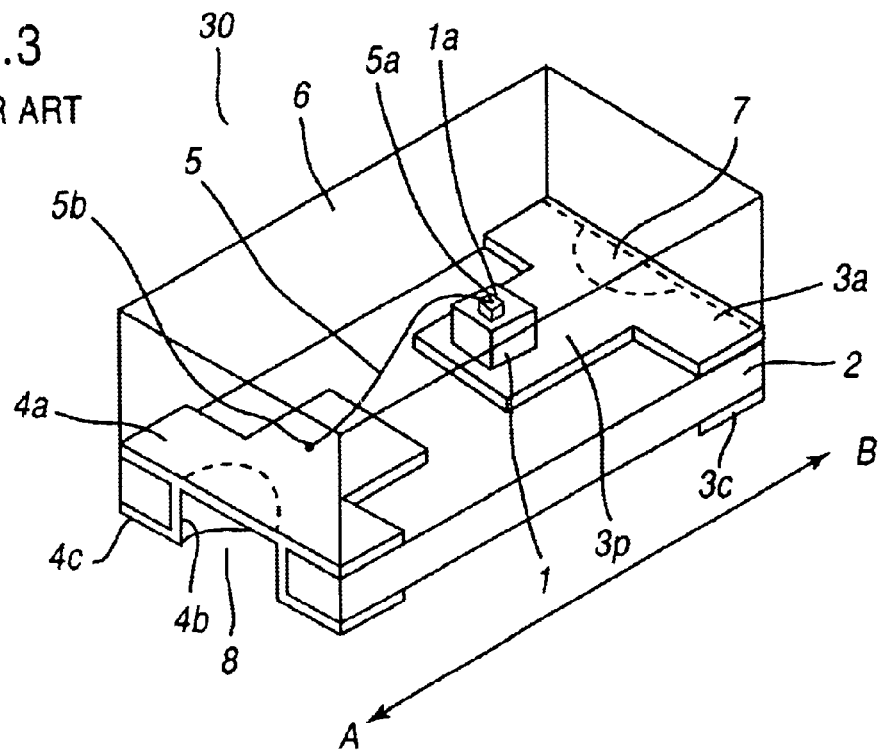
FIG. 3 is a perspective view which summarizes a conventional chip type light emitting device.
Figure 4:
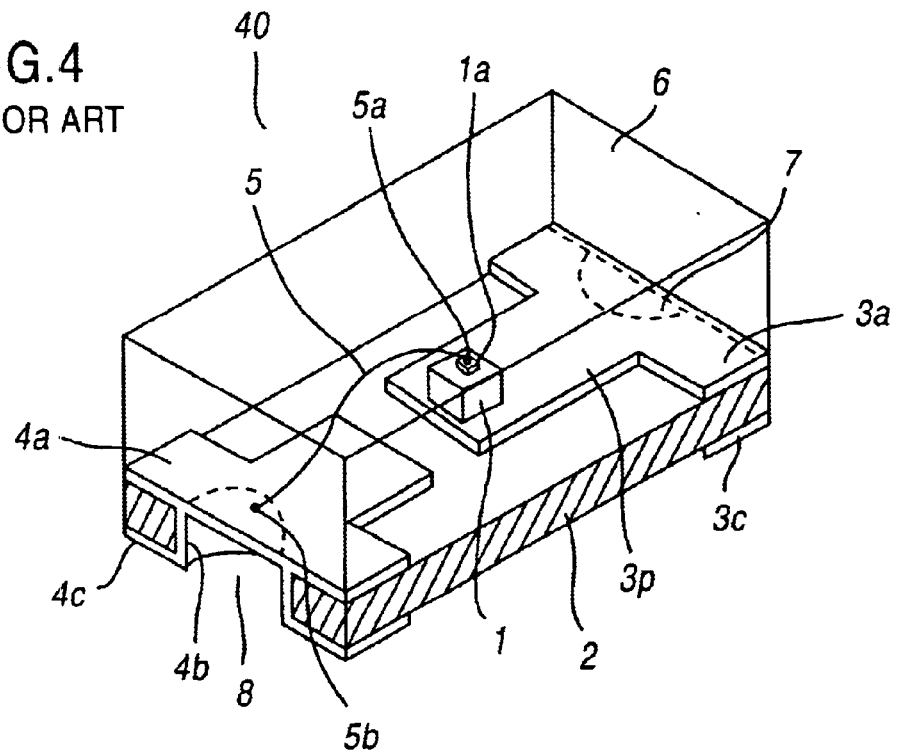
FIG. 4 is a perspective view which summarizes a conventional chip type light emitting device.
Figure 5:
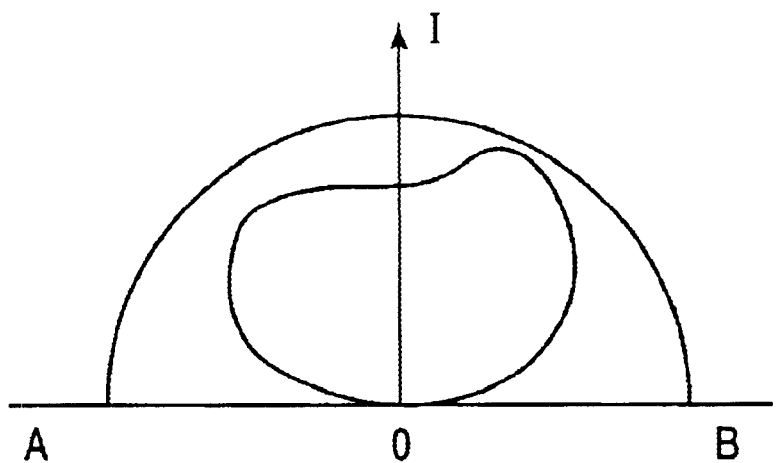
FIG. 5 is a characteristics diagram which shows the luminous intensity in a longitudinal direction of a conventional chip type light emitting device.

Now, a description will be given in more detail of preferred embodiments of the present invention with reference to the accompanying drawings. FIG. 1 is a perspective view which illustrates the chip type light emitting device 10 with the embodiment of the present invention.

A pair of electrode patterns 13 and 14 comprised of conductive layer such as copper (Cu) plate layer is formed at the both ends of the board 12. One electrode pattern 13 consists of the surface electrode 13a, side face electrode 13b and back electrode 13c.

The other electrode pattern 14 also consists of the surface electrode 14a, side face electrode 14b and back electrode 14c. The side face electrode 13b and side face electrode 14b of a pair of electrode patterns 13 and 14 form several elliptical through holes in parallel on an original large-sized board on which the board 2 can be obtained by dividing, the internal surface of the elliptical though holes is plated with Cu, etc., and the surface electrodes 13a/14a and back electrodes 13c/14c of a pair of electrode patterns 13 and 14 are connected to each other.

The pad 13p is formed on the surface of the board 12 to be electrically connected with the surface electrode 13a of one electrode pattern 13 and the LED chip 11 is mounted there by die-bonding. One end 15a of the metal wire 15 is connected electrically with the electrode 11a of the LED chip 11 by wire bonding. The other end 15b of the metal wire 15 is connected electrically with the surface electrode 14a of the other electrode pattern 14 by wire bonding. The ultrasonic wave is used in this wire bonding.

The LED chip 11 mounted on the board 12, in which the lower electrode is connected to the surface electrode 13a of one electrode pattern 13 by the die-bonding, and the metal wire 15 connected electrically with the upper electrode 11a of the LED chip 11 and with the surface electrode 14a of the other electrode pattern 14 by wire bonding are sealed with the translucent resin mold 16.

In FIG. 1, the shape of the board 12 is nearly rectangular shape in a plan view (e.g., 10 mm in length×0.5 mm in width) and the first electrode pattern 13 and the second electrode pattern 14 are formed at both ends in a longitudinal direction of the surface of the board 12. The semi-cylindrical notch 17, which penetrates perpendicularly, is formed at the center of one end of the board 2. Moreover, the notches 18a and 18b, which penetrate perpendicularly, at both sides in a crosswise direction (width direction), are formed at the other end of the board 12.

The surface electrodes 13a and 14a of the first and second electrodes 13 and 14 project like eaves on the notch 17 at one side and on the two notches 18a and 18b at the other side. The side electrodes 13b and 14b, which are connected to the surface electrodes 13a and 14a, are formed and exposed on the internal side walls of such notch 17 and such notches 18a and 18b. Moreover, the back electrodes 13c and 14c are formed at both ends of the back of the board 12.

The two notches 18a and 18b can be formed at both side at one end of the board 12 by selecting the position to form the notches when several chip type light emitting devices are manufactured from one large-sized board equipped with several LED chips and by setting the positions to cut the large-sized board longitudinally and transversely to form individual chip type light emitting devices to the positions of the notches 18a and 18b shown in FIG. 1.

The LED chip 11, of which lower face electrode is connected to the surface electrode 13a, is centered on the surface of the board 2 and the upper face electrode 11a of the LED chip 1 is connected to the surface electrode 14a at one end 15a of the metal wire 15 such as gold (Au) by wire bonding. The metal wire 15 is arranged from the center of the board 12 to the other end of the board 2, which is the center at the width direction, that is, toward the position of the surface electrode 14a between the notches 18a and 18b. The other end 15b of the metal wire is connected to the surface electrode 14a at the end of the board 12.

The surface electrodes 13a and 14a of the first electrode pattern 13 and the second electrode pattern 14 cover the notch 17 and the notches 18a and 18b, and the ends of the first and second electrode patterns 13 and 14 are arranged at both ends of the board 12. Moreover, the positions of both ends of translucent resin mold 16 are arranged to the positions of both ends of the board 12.

In the configuration of FIG. 1, a part of the board 12 is located between the two notches 11a and 18b. Therefore, a connecting position of the other end 15b of the metal wire 5 and the surface electrode 14b of the electrode pattern 4 is formed on the board 2. A lower part of horn of ultrasonic wave device is supported by this board. So, enough pressure can be applied, and the other end 15b of the metal wire 15 and the surface electrode 14b of the electrode pattern 14 can be bonded completely by the ultrasonic wave. Therefore, the wire bonding reliability can be enhanced.

Figure 6:
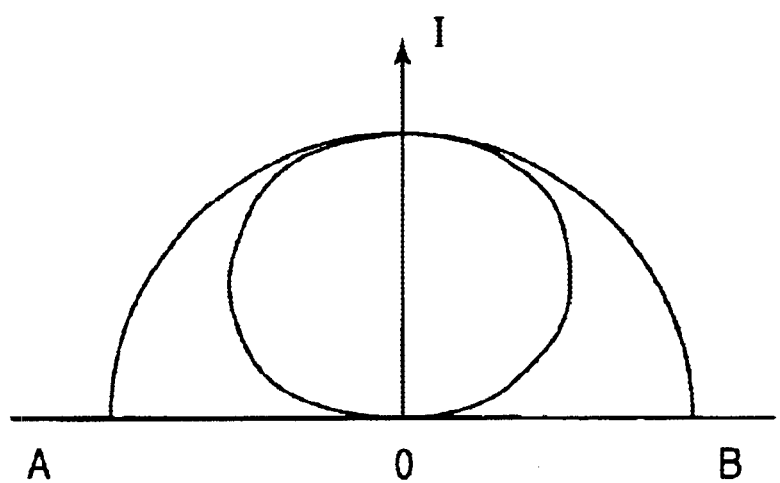
FIG. 6 is a characteristics diagram which shows the luminous intensity in a longitudinal direction of the chip type light emitting device with the embodiment of the present invention.

FIG. 6 is a characteristics diagram which shows the distribution of luminous intensity I of the chip type light emitting device of FIG. 1. For the chip type light emitting device of FIG. 1, as shown in FIG. 6, the ideal symmetric luminous intensity characteristics can be obtained in a longitudinal direction of the board 12 by centering the LED chip 1 on the board 12. Also, wire bonding can be made stably by extending the other end 15b of the metal wire 15 to a position close to the end of the board 2.

Furthermore the one notch 17 is formed at one end of the board 12 and the two notches 18a and 18b are formed at the other end. So, the polarity of the LED chip 11 can be checked easily according to the number of notches. If the translucent resin mold 16 is milk white, the LED chip 11 embedded in the translucent resin mold 16 is illegible. However, even in this case, the polarity can be checked easily based on the appearance of chip type light emitting device 10.

In ultra small-sized chip type light emitting device of which size is 10 mm in length×0.5 mm in width, it is difficult to show the polarity in resist. It is very useful to check the polarity according to the number of formed notches as described above.

Moreover, the positions of both ends of the translucent resin mold 16 are arranged to the positions of longitudinal ends of the board 12

Moreover, the positions of both ends of translucent resin mold 16 are arranged to the positions of both ends in a longitudinal direction of the board 12. Therefore, the contact area for picking up can be increased and handling process can be performed smoothly to small-sized chip type light emitting device.

What is claimed is:

1. A chip type light emitting device comprising:
   a board of nearly rectangular shape in a plane view;
   first and second electrode patterns formed at both ends in a longitudinal direction of a surface of said board;
   a light emitting diode (LED) chip mounted on said first electrode pattern;
   a metal wire connected to said LED chip and said second electrode pattern by wire bonding; and
   a translucent resin mold which seals said LED chip and said metal wire;
   wherein one notch is formed at one end of said board at said first electrode pattern side and two notches are formed at both sides of the other end of said board at said second electrode pattern side, each of said electrode patterns is formed so as to cover said one notch or two notches through an entire width of said board, and the positions at both ends of said translucent resin mold are arranged to the positions at both ends in a longitudinal direction of said board.

2. The chip type light emitting device of claim 1, wherein said LED chip is almost centered on said board.

3. The chip type light emitting device of claim 1, wherein said board size is 1.6 mm×0.8 mm or less.

4. The chip type light emitting device of claim 1, wherein said metal wire is connected to said LED chip and the surface of said second electrode pattern which is located on a portion of said board between said two notches formed at both sides of the other end of said board at said second electrode pattern side, by wire bonding.

5. The chip type light emitting device of claim 1, wherein said one notch formed at said one end of said board at said first electrode pattern side is semi-cylindrical and said two notches formed at both sides of the other end of said board at said second electrode pattern side are quarter-cylindrical.

* * * * *